(12) United States Patent
Wei et al.

(10) Patent No.: US 9,406,481 B2
(45) Date of Patent: *Aug. 2, 2016

(54) TRANSMISSION ELECTRON MICROSCOPE MICRO-GRID

(71) Applicants: Tsinghua University, Beijing (CN); HON HAI PRECISION INDUSTRY CO., LTD., New Taipei (TW)

(72) Inventors: Yang Wei, Beijing (CN); Xiao-Yang Lin, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/738,952

(22) Filed: Jun. 15, 2015

(65) Prior Publication Data
US 2015/0364294 A1 Dec. 17, 2015

(30) Foreign Application Priority Data
Jun. 17, 2014 (CN) .......................... 2014 1 0269195

(51) Int. Cl.
| H01J 37/00 | (2006.01) |
| H01J 37/20 | (2006.01) |
| H01J 37/26 | (2006.01) |
| B82Y 30/00 | (2011.01) |

(52) U.S. Cl.
CPC ................. *H01J 37/20* (2013.01); *H01J 37/26* (2013.01); *B82Y 30/00* (2013.01); *H01J 2237/0216* (2013.01); *Y10S 977/742* (2013.01)

(58) Field of Classification Search
CPC ....... H01J 37/20; H01J 37/26; Y10S 977/742; B82Y 99/00

USPC ......... 250/306, 307, 310, 311, 440.11; 216/2, 216/17
See application file for complete search history.

(56) References Cited

U.S. PATENT DOCUMENTS

| 8,727,827 | B2 | 5/2014 | Guo et al. | |
| 8,772,736 | B2 | 7/2014 | Feng et al. | |
| 2011/0020563 | A1* | 1/2011 | Jiang | H01J 37/20 427/554 |
| 2011/0159269 | A1 | 6/2011 | Qian et al. | |
| 2014/0013584 | A1 | 1/2014 | Wang et al. | |
| 2014/0017552 | A1 | 1/2014 | Wang et al. | |
| 2015/0364293 | A1* | 12/2015 | Wei | H01J 37/20 216/17 |

FOREIGN PATENT DOCUMENTS

| TW | 201127887 | 8/2011 |
| TW | 201137922 | 11/2011 |

(Continued)

*Primary Examiner* — Michael Maskell
(74) *Attorney, Agent, or Firm* — ScienBiziP, P.C.

(57) ABSTRACT

A transmission electron microscope micro-grid includes a carbon nanotube layer sandwiched between a first metal layer and a second metal layer. The carbon nanotube layer includes a first surface and a second surface opposite to each other, and the carbon nanotube layer comprises a number of carbon nanotubes. The first metal layer is attached on the first surface. The second metal layer is attached on the second surface. The first metal layer and the second metal layer are bonded with the carbon nanotube layer via a number of dangling bonds on the number of carbon nanotubes, the first metal layer defines a number of first through holes, the second metal layer defines a number of second through holes, and the carbon nanotube layer is exposed through the number of first through holes and the number of second through holes.

17 Claims, 8 Drawing Sheets

(56) References Cited

FOREIGN PATENT DOCUMENTS

| TW | 201403914 | 1/2014 |
| TW | 201403933 | 1/2014 |
| TW | 201415531 | 4/2014 |
| TW | 201418442 | 5/2014 |

\* cited by examiner

Provid a carbon nanotube layer comprising a first surface and a second surface opposite to each other, wherein a plurality of apertures are defined in the carbon nanotube layer

↓

Electroplate a first metal layer on the first surface and electroplating a second metal layer on the second surface

↓

Form a plurality of first through holes by etching the first metal layer and forming a plurality of second through holes by etching the second metal layer, wherein the carbon nanotube layer is exposed through the plurality of first through holes and the plurality of second through holes.

TRANSMISSION ELECTRON MICROSCOPE MICRO-GRID

CROSS-REFERENCE TO RELATED APPLICATIONS

This application claims all benefits accruing under 35 U.S.C. §119 from China Patent Application No. 201410269195.X, filed on Jun. 17, 2014, in the China Intellectual Property Office, the contents of which are hereby incorporated by reference.

BACKGROUND

1. Technical Field

The present disclosure relates to a transmission electron microscope micro-grid, especially relates to a transmission electron microscope micro-grid based on carbon nanotubes.

2. Description of Related Art

In a transmission electron microscope, a porous carbon supporting film (i.e., micro-grid) is used to carry powder samples to observe high resolution transmission electron microscopy images. With the development of nanotechnology, micro-grids are increasingly coming into widespread use in the field of electron microscopy. The micro-grids used in TEMs are usually manufactured using a layer of organic porous membrane covered on a metal mesh net, such as a copper mesh net or a nickel mesh net, and subsequently a layer of non-crystal carbon films are deposited thereon by evaporation.

Carbon nanotubes have special structures and excellent properties, and can form a carbon nanotube structure. The carbon nanotube structure can be used in the TEM micro-grids to reduce the interference non-crystal carbon films have on samples. However, the weight of the carbon nanotubes are light, therefore, the carbon nanotube structure is also light. If the carbon nanotube structure is used in the TEM micro-grids, the carbon nanotube structure floats, thereby affecting resolution transmission of the electron microscopy images and accuracy of measurement.

What is needed, therefore, is to provide a TEM micro-grid which can prevent the carbon nanotube structure from floating when the micro-grid is used in TEM.

BRIEF DESCRIPTION OF THE DRAWING

Many aspects of the present disclosure can be better understood with reference to the following drawings. The components in the drawings are not necessarily to scale, the emphasis instead being placed upon clearly illustrating the principles of the present embodiments.

FIG. 6 shows a flowchart of one embodiment of a method of making transmission electron microscope micro-grid.

DETAILED DESCRIPTION

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean at least one.

Figure 1:
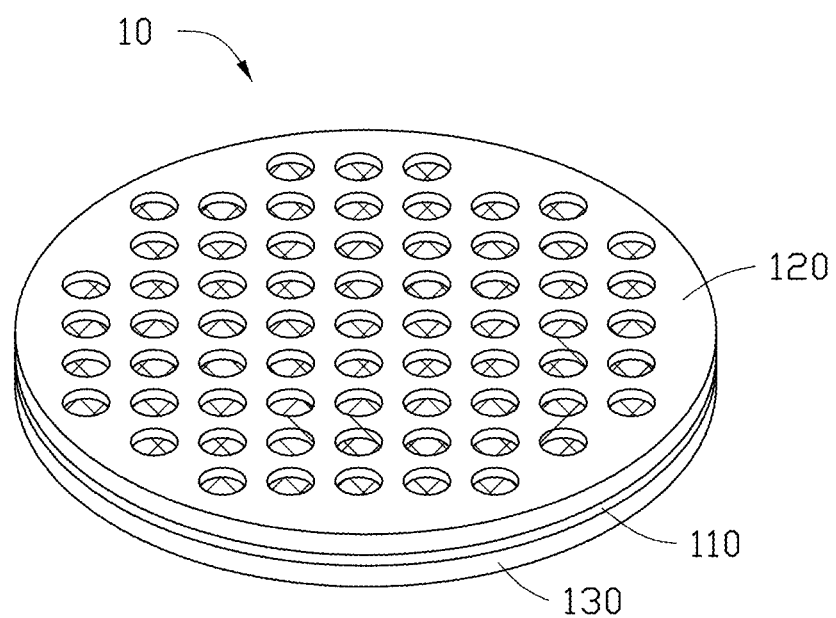
FIG. 1 shows a schematic view of one embodiment of a method of making transmission electron microscope (TEM) micro-grid.
Figure 2:
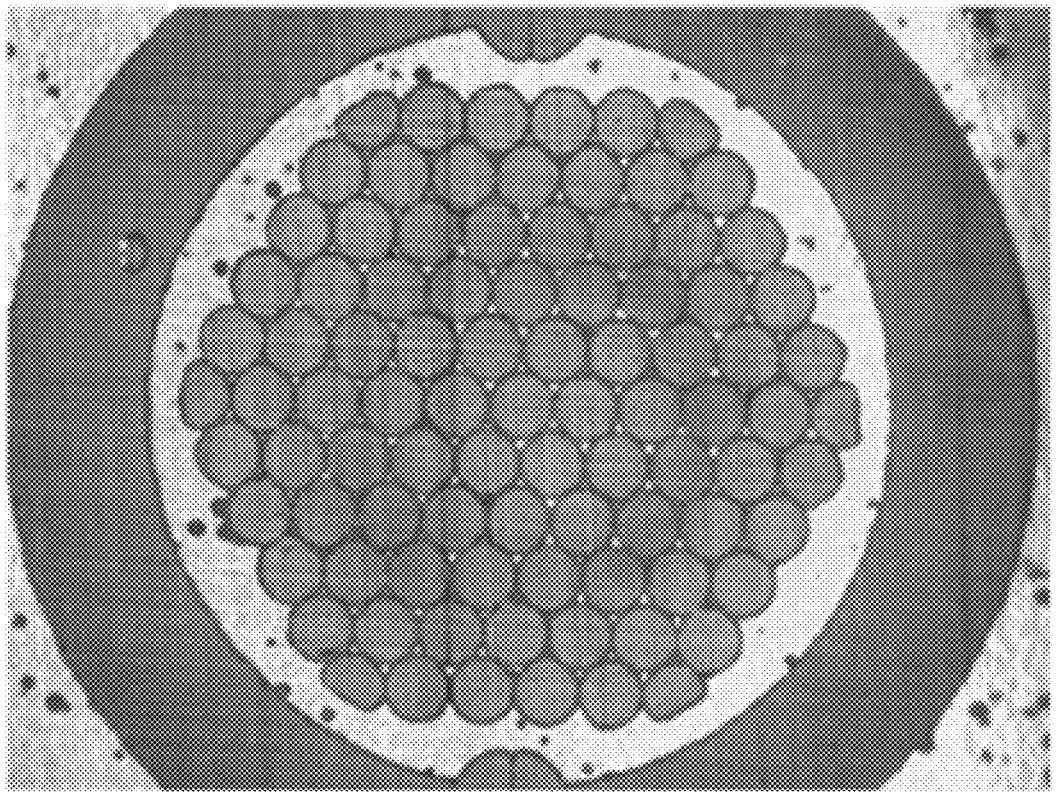
FIG. 2 shows a photographic of the TEM micro-grid in FIG. 1.

Referring to FIGS. 1-2, one embodiment of TEM micro-grid 10 comprises a carbon nanotube layer 110 sandwiched between a first metal layer 120 and a second metal layer 130.

Figure 3:
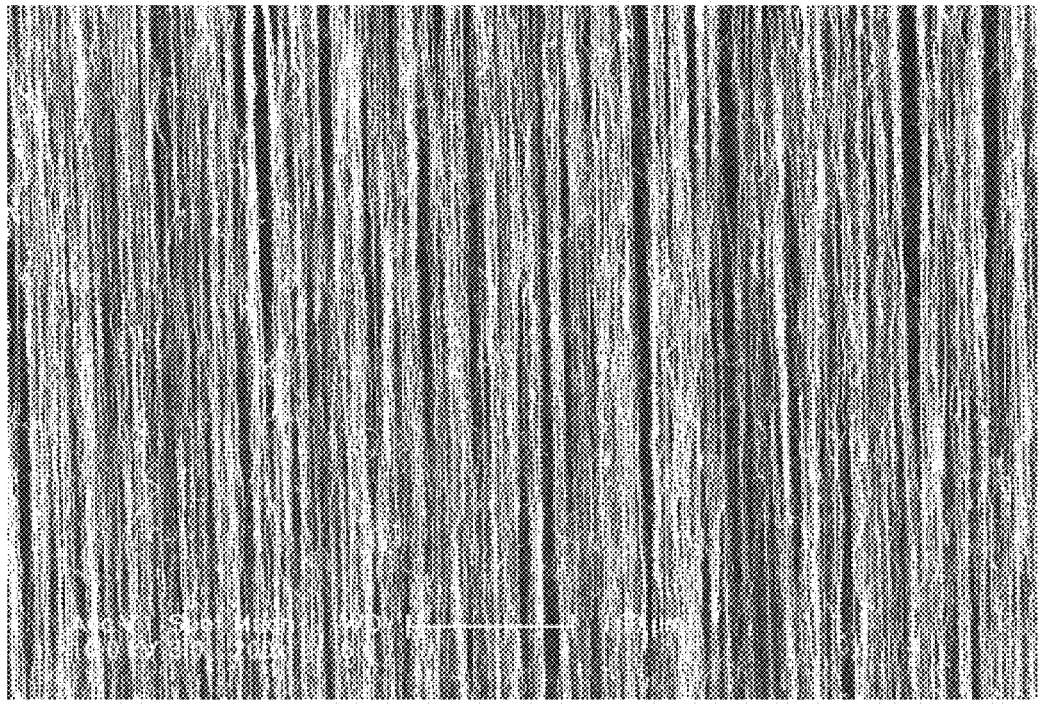
FIG. 3 shows a Scanning Electron Microscope (SEM) image of one embodiment of a carbon nanotube film.

The carbon nanotube layer 110 comprises a first surface 111 and a second surface 113 opposite to each other. The carbon nanotube layer 110 comprises at least one carbon nanotube film. In one embodiment, the carbon nanotube layer 110 can comprises a plurality of carbon nanotube films stacked together. Referring to FIG. 3, each of the plurality of carbon nanotube films comprises a plurality of carbon nanotubes. The plurality of carbon nanotubes that can be arranged substantially parallel to a surface of the carbon nanotube film. A large number of the carbon nanotubes in the carbon nanotube film can be oriented along a preferred orientation, meaning that a large number of the carbon nanotubes in the carbon nanotube film are arranged substantially along the same direction. An end of one carbon nanotube is joined to another end of an adjacent carbon nanotube arranged substantially along the same direction, by Van der Waals attractive force. A small number of the carbon nanotubes may be randomly arranged in the carbon nanotube film, and has a small if not negligible effect on the larger number of the carbon nanotubes in the carbon nanotube film arranged substantially along the same direction. The carbon nanotube film is capable of forming a free-standing structure. The term "free-standing structure" can be defined as a structure that does not have to be supported by a substrate. For example, a free standing structure can sustain the weight of itself when it is hoisted by a portion thereof without any significant damage to its structural integrity. So, if the carbon nanotube film is placed between two separate supporters, a portion of the carbon nanotube film, not in contact with the two supporters, would be suspended between the two supporters and yet maintain film structural integrity.

Figure 4:
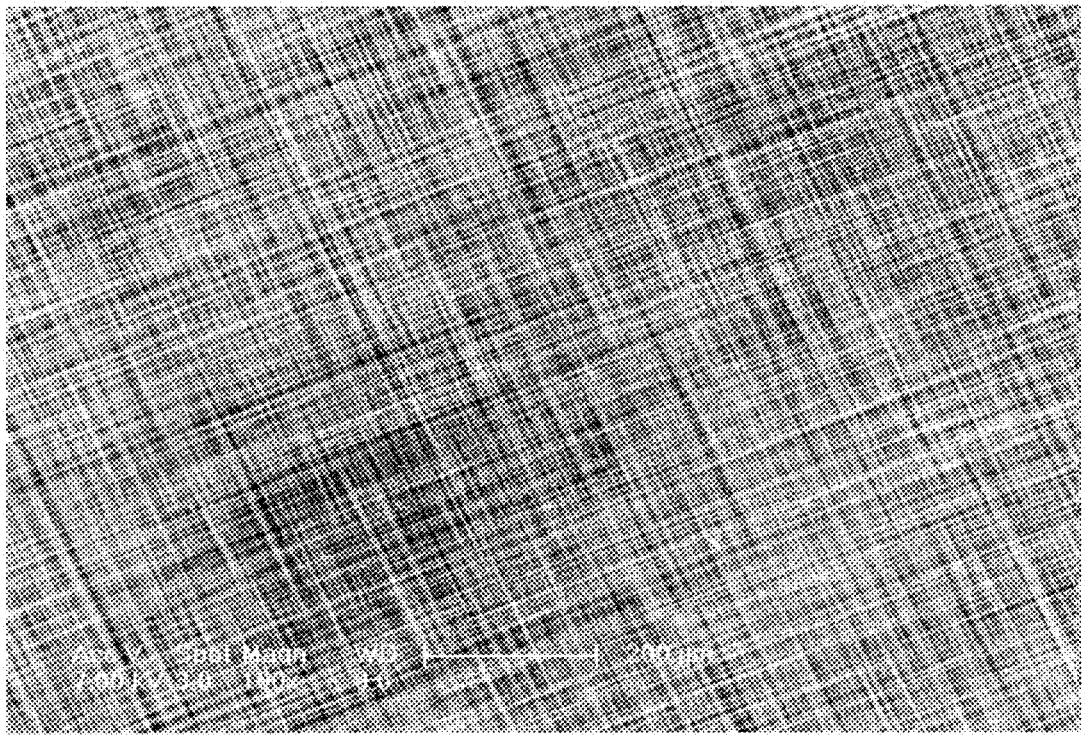
FIG. 4 shows a SEM image of one embodiment of a carbon nanotube layer.

Referring to FIG. 4, the carbon nanotube layer 110 comprises the plurality of carbon nanotube films. The plurality of carbon nanotubes in different carbon nanotube films can be intersected with each other. Thus the plurality of carbon nanotube films forms a network. A plurality of apertures 112 are defined in the carbon nanotube layer 110. The plurality of apertures 112 are first through holes along the thickness of the carbon nanotube layer 110. A size of each of the plurality of apertures 112 can range from about 1 nanometer to about 1 micrometer. In one embodiment, the thickness of the carbon nanotube layer 110 is smaller than 100 micrometers. Thus the first metal layer 120 and the second metal layer 130 can be easily penetrate the carbon nanotube layer 110 and combined together.

In one embodiment, the carbon nanotube layer 110 can include at least one carbon nanotube network. The carbon nanotube network is made by at least one carbon nanotube wire and defines a plurality of micropores. The effective diameters of the micropores can be from about 1 nm to about 1 μm. Each carbon nanotube wire can be composed of carbon nanotubes.

The carbon nanotube wire can be an untwisted carbon nanotube wire or a twisted carbon nanotube wire. An untwisted carbon nanotube wire is formed by treating a carbon nanotube film with an organic solvent. The untwisted carbon nanotube wire includes a plurality of successive carbon nanotubes substantially oriented along an axis of the untwisted carbon nanotube wire and joined end-to-end by van der Waals attraction force therebetween. The untwisted carbon nanotube wire has a diameter ranging from about 0.5 nm to about 1 mm.

A twisted carbon nanotube wire is formed by twisting a carbon nanotube film by a mechanical force. The twisted carbon nanotube wire includes a plurality of carbon nanotubes oriented around an axis of the twisted carbon nanotube wire. The length of the twisted carbon nanotube wire can be set as desired and the diameter of the carbon nanotube wire can range from about 0.5 nm to about 100 micrometers. The twisted carbon nanotube wire can be treated with an organic solvent before or after twisting.

The first metal layer 120 is attached on the first surface 111. Furthermore, the first metal layer 120 connects to the first metal layer 110 via a plurality of dangling bonds on an outer surface of each of the carbon nanotubes in the carbon nanotube layer 110. Thus the first metal layer 120 can be tightly attached on the first surface 111.

Figure 5:
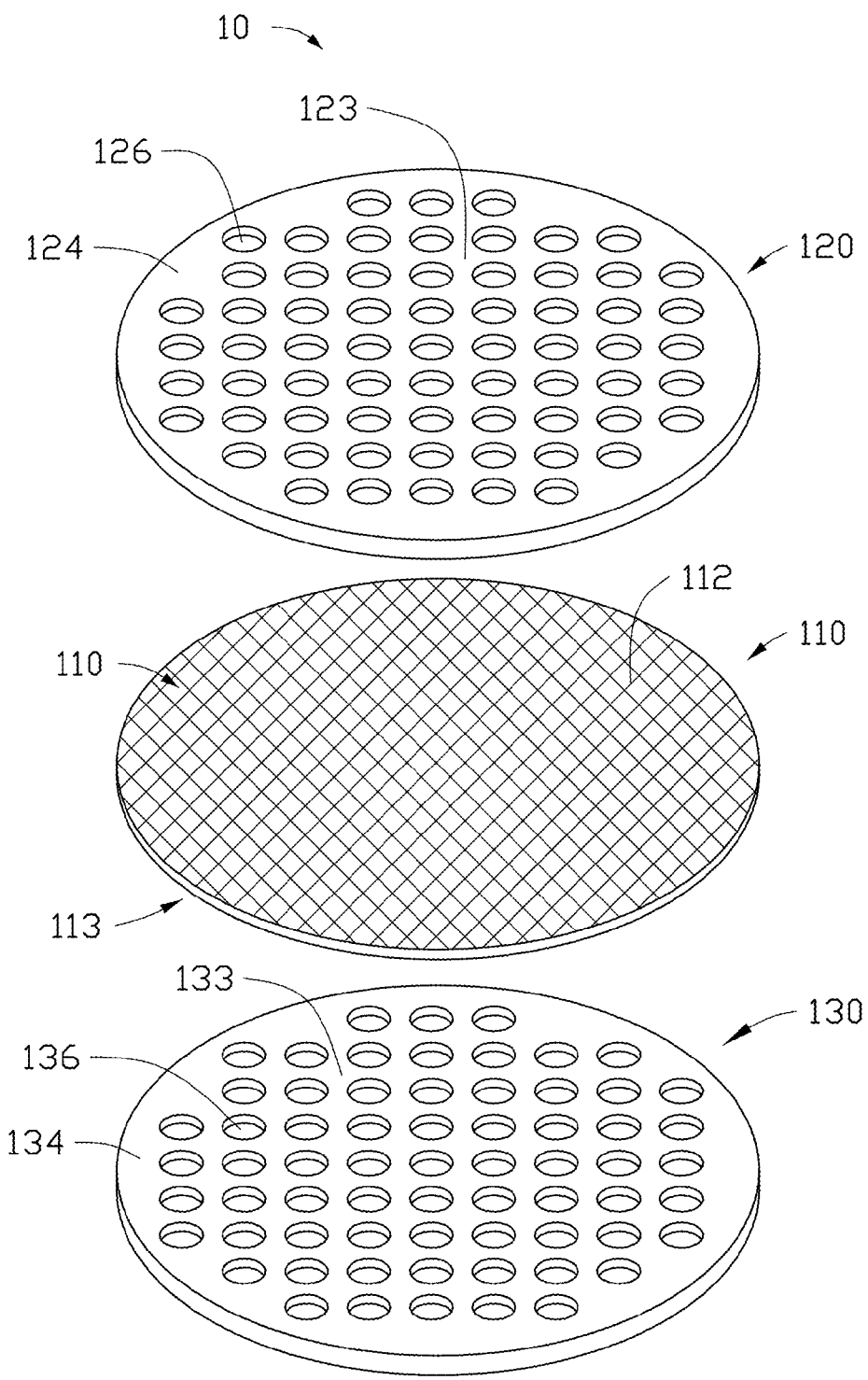
FIG. 5 is an exploded, isometric view of the TEM micro-grid of FIG. 1.

Referring to FIG. 5, the first metal layer 120 is a continuous structure. The first metal layer 120 covers entire the first surface 111. The first metal layer 120 comprises a first support edge 124, and at least one first through hole 126 is defined in the first metal layer 120. The first support edge 124 surround the at least one first through hole 126. The first support edge 124 is configured to attach the carbon nanotube layer 110. A shape of the first through hole 126 can be circle, square, hexagon, octagon, or oval. A thickness of the first metal layer 120 can range from about 1 micrometer to about 15 micrometer. In one embodiment, the thickness of the first metal layer 120 is about 1 micrometer.

In one embodiment, the first metal layer 120 is in a shape of circle with a plurality of first through holes. The first metal layer 120 forms a plurality of first grid 123 surrounded by the first support edge 124. The first through hole 126 is defined in each of the plurality of first grid 123. Furthermore, the first support edge 124 are integrated with the plurality of first grid 123 to form an continuous and integrated structure. A size of the first through hole 126 can range from about 10 micrometers to about 150 micrometers. The "size" of the first through hole 126 means the maximum span of the first through hole 126. In one embodiment, the first through hole 126 is circular, and the diameter is about 15 micrometers.

The plurality of first grids 123 are connected with each other to form a network. The plurality of first through holes 126 can be aligned with a certain distance to form an array. The plurality of first through holes 126 can be aligned with a first distance along each column of the array. The plurality of first through holes 126 can be aligned with a second distance along each row of the array. The plurality of first through holes 126 can also be uniformly distributed in the first metal layer 120. The distance between the adjacent two first through holes 126 is about 20 micrometers. A material of the first metal layer 120 can be copper, gold, silver, nickel, or molybdenum. The plurality of first grids 123 can be formed by etching the first metal layer 120. In one embodiment, an outer diameter of the first support edge 124 can be about 3 micrometers, and the material of the first metal layer 120 is copper.

The first metal layer 120 can be formed on a first surface 111 of the carbon nanotube layer 110 via electroplating. The carbon nanotube layer 110 can partly covers the plurality of first through holes 126. In one embodiment, the carbon nanotube layer 110 covers all the plurality of first through holes 126. The first surface 111 can be exposed through the plurality of through holes 126. The carbon nanotubes in the carbon nanotube layer 110 can be bonded with the plurality of grids 123.

The structure of the second metal layer 130 can be same as the first metal layer 120. Furthermore, because the carbon nanotube layer 110 defines the plurality of apertures 112, the second metal layer 130 penetrates the carbon nanotube layer 110 and combines the first metal layer 120 through the plurality of apertures 112.

The second metal layer 130 comprises a second support edge 134 and a plurality of second grids 133. A second through hole 136 is defined in each of the plurality of second grids 133. The second support edge 134 surrounds the plurality of second grids 133. The carbon nanotube layer 120 is sandwiched between the first support edge 124 and the second support edge 134. In detail, the edge of the carbon nanotube layer 110 is fixed between the first support edge 124 and the second support edge 134. Furthermore, the first support edge 124 and the second support edge 134 are combined with the carbon nanotube layer 110 through the plurality of dangling bonds on the two opposite surfaces of the carbon nanotube 110. The first metal layer 120 is in direct contact with the second metal layer 130 through the plurality of apertures 112.

The distribution of the plurality of second grids 133 can be same as the distribution of the plurality of first grids 123. The plurality of second grids 133 can also be mismatched with the plurality of first grids 123. The carbon nanotube layer 110 can be partly sandwiched between the plurality of first grids 123 and the plurality of second grids 133. Furthermore, the distribution of the plurality of first through holes 126 can also be same as the distribution of the plurality of second through holes 136. The plurality of first through holes 126 and the plurality of second through holes 136 are opposite to each other. The plurality of first through holes 126 and the plurality of second through holes 136 can be distributed by one to one correspondence. The carbon nanotube layer 110 can be exposed through the plurality of first through holes 126 and the plurality of second through holes 136 at the same time. Thus a plurality of through channels are formed in the TEM micro-grids. A transmission portion can be defined by each pair of the first through hole 126 and the second through hole 136 at each of the plurality of through channels. The carbon nanotube layer 110 is suspended at the transmission portion. Thus a part of the carbon nanotube layer 110 is exposed and suspended, and the other part of the carbon nanotube layer 110 is sandwiched between the first metal layer 120 and the second metal layer 130.

In use, the samples are deposited on the carbon nanotube layer 110 of the TEM micro-grid 10, and the samples are observed through the plurality of transmission portion.

The TEM micro-grid 10 has following advantages. The first metal layer and the second metal layer are combined with the carbon nanotube layer through the plurality of dangling bonds, thus the carbon nanotube layer can be firmly fixed between the first metal layer and the second metal layer. The stability of the TEM micro-grid can be improved. The carbon nanotubes can be firmly fixed, and the floats of the carbon nanotubes and the pollution to the samples can be avoided. Furthermore, the samples can be tightly attracted and fixed by the carbon nanotubes through the transmission portion, thus the accuracy can be improved.

Referring to FIG. 6, one embodiment of a method of making transmission electron microscope micro-grid 10 comprises:

step (S10), providing a carbon nanotube layer 110, wherein the carbon nanotube layer 110 comprises a first surface 111 and a second surface 113 opposite to each other, and the carbon nanotube layer 110 comprises a plurality of carbon nanotubes;

step (S11), forming a carbon nanotube composite layer 11 via electroplating a first metal layer 120 on the first surface 111 and electroplating a second metal layer 130 on the second surface 113; and step (S12), forming a plurality of first through holes 126 in the first metal layer 120 and a plurality of second through holes 136 in the second metal layer 130 by etching the first metal layer 120 and the second metal layer 130, wherein the plurality of first through holes 126 and the plurality of second through holes 136 are opposite to each other.

In step (S10), the carbon nanotube layer 110 can be located on a support (not shown). Furthermore, the carbon nanotube layer 110 can be suspended on a frame (not shown). The carbon nanotube layer 110 is a free-standing structure, and the carbon nanotube layer 110 can be suspended on the support or the frame.

The carbon nanotube layer 110 comprises a plurality of carbon nanotube films stacked together. Referring to FIG. 3, each of the plurality of carbon nanotube films comprises a plurality of carbon nanotubes. The plurality of carbon nanotubes that can be arranged substantially parallel to a surface of the carbon nanotube film. A large number of the carbon nanotubes in the carbon nanotube film can be oriented along a preferred orientation, meaning that a large number of the carbon nanotubes in the carbon nanotube film are arranged substantially along the same direction. An end of one carbon nanotube is joined to another end of an adjacent carbon nanotube arranged substantially along the same direction, by Van der Waals attractive force. A small number of the carbon nanotubes may be randomly arranged in the carbon nanotube film, and has a small if not negligible effect on the larger number of the carbon nanotubes in the carbon nanotube film arranged substantially along the same direction. The carbon nanotube film is capable of forming a free-standing structure. The term "free-standing structure" can be defined as a structure that does not have to be supported by a substrate. For example, a free standing structure can sustain the weight of itself when it is hoisted by a portion thereof without any significant damage to its structural integrity. So, if the carbon nanotube film is placed between two separate supporters, a portion of the carbon nanotube film, not in contact with the two supporters, would be suspended between the two supporters and yet maintain film structural integrity.

The plurality of carbon nanotubes in different carbon nanotube films can be intersected with each other. Thus the plurality of carbon nanotube films forms a network. A plurality of apertures 112 are defined in the carbon nanotube layer 110. The plurality of apertures 112 are first through holes along the thickness of the carbon nanotube layer 110. In one embodiment, the carbon nanotube layer is suspended on the frame.

In step (S11), the first metal layer 120 is deposited on the first surface 111 via electroplating method. The second metal layer 130 is deposited on the second surface 113. The first metal layer 120 and the second metal layer 130 can be formed by:

step (S111), providing a metal ions solution, wherein the metal ions solution comprises a plurality of metal ions;

step (S112), immersing the carbon nanotube layer 110 into the metal ions solution, wherein the first surface 111 and the second surface 113 are exposed in the metal ions solution, and the carbon nanotube layer 110 is spaced from a electrode plate 140; and step (S113), applying a voltage between the carbon nanotube layer 110 and the electrode plate 140, wherein the plurality of metal ions are reduced into metal particles and coated on the first surface 111 and the second surface 113.

In step (S111), the density of the plurality of metal ions can be selected according to the thickness of the first metal layer 120 and the second metal layer 130. In one embodiment, the plurality of metal ions are formed by dissolving cooper sulfate into the water.

In step (S112), the carbon nanotube layer 110 is spaced from the electrode plate 140. A distance between the carbon nanotube layer 110 and the electrode plate 140 can range from about 0.5 millimeters to about 3 millimeters. The carbon nanotube layer 110 can be parallel with the electrode plate 140. The material of the electrode plate 140 can be graphene, platinum, stainless steel, or carbon nanotube layer structure. The material of the electrode plated 140 can be inertia material in the metal ions solution. The size of the electrode plate 140 can be greater than the carbon nanotube layer.

The carbon nanotube layer 140 can be suspended in the metal ions solution. Furthermore, because the carbon nanotube layer 140 is fixed on the frame, the carbon nanotube layer 140 in the frame will be exposed in the metal ions solution. In one embodiment, the electrode plate 140 is copper plate, and the size of the copper plate is greater than the carbon nanotube layer 110.

In step (S113), a potential difference is applied between the carbon nanotube layer 110 and the electrode plate 140. The electrode plate 140 is electrically connected to a positive electrode, and the carbon nanotube layer 110 is electrically connected to a negative electrode. Thus the metal ions will be reduced into metal particles, and the metal particles will be deposited on the carbon nanotube layer 110. Furthermore, the metal particles are deposited on an outer surface of each of the plurality of carbon nanotubes. During the process of electroplating, a plurality of dangling bonds are formed on the outer surface of the plurality of carbon nanotubes, and the metal particles are tightly combined with the plurality of carbon nanotubes via the plurality of dangling bonds. Furthermore, the plurality of metal particles are connected with each other to form a continuous layered structure on the first surface 111 and the second surface 113. Thus both the first metal layer 120 and the second metal layer 130 are continuously layered structure. In addition, the metal particles can be deposited on the outer surface of adjacent carbon nanotubes around each of the plurality of apertures 112. Thus the first metal layer 120 and the second metal layer 130 are combined together to form an integrated structure. The carbon nanotube layer 110 is firmly sandwiched between the first metal layer 120 and the second metal layer 130.

In one embodiment, a constant voltage is applied between the carbon nanotube layer 110 and the electrode plate 140. The potential difference between the carbon nanotube layer 110 and the electrode plate 140 ranges from about 0.5 V to about 1.2 V, and an electroplating time range from about 0.5 hours to about 4 hours.

Furthermore, the first metal layer 120 and the second metal layer 130 can be formed one after another. In one embodiment, the second surface 113 can be attached on a substrate (not shown), and the first surface 111 is exposed in the metal ion solution. The first metal layer 120 can be formed on the first surface 111. The carbon nanotube layer 110 with the first metal layer 120 is turned over, and the second surface 113 is exposed in the metal ion solution. The second metal layer 130 is formed on the second surface 113.

Furthermore, during forming the second metal layer 130, the metal particles can be deposited into the plurality of apertures 112. Thus the second metal layer 130 can penetrate the carbon nanotube layer 110 and combined with the first metal layer 120 through the plurality of apertures 112. The carbon nanotube layer 110 is sandwiched between the first metal layer 120 and the second metal layer 130.

Furthermore, the carbon nanotube composite layer 11 can be washed to remove the impurity. Then the carbon nanotube composite layer 11 can be dried, and the first metal layer 120 and the second metal layer 130 can be tightly attached on the carbon nanotube layer 110.

Figure 7:
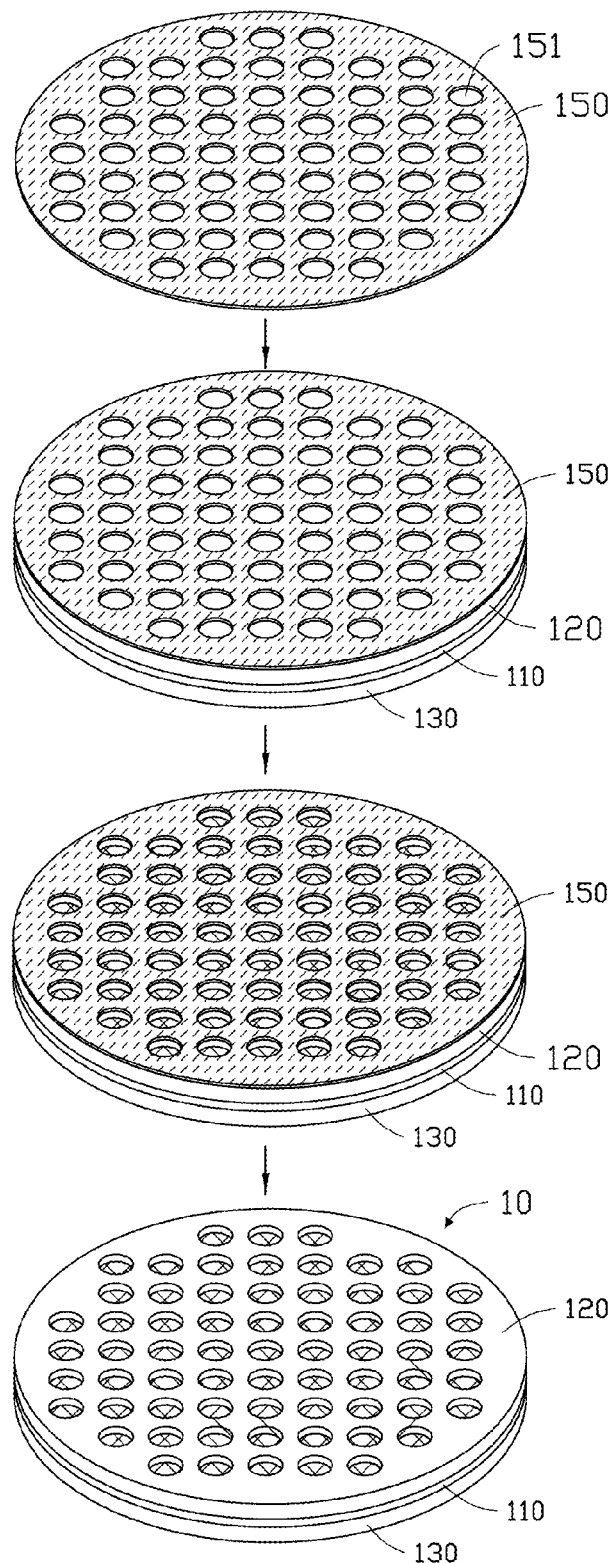
FIG. 7 shows a flowchart of one embodiment of an etching process in the method of FIG. 6.

In step (S12), the plurality of first through holes 126 and the plurality of second through holes 136 can be formed by physically etching or chemical etching. Referring to FIG. 7, the plurality of first through holes 126 and the plurality of second through holes 136 can be formed by:

step (S121), providing a mask layer 150, wherein the mask layer 150 defines a plurality of through holes 151;

step (S122), applying the mask layer 150 on the second metal layer 130, wherein the second metal layer 130 is exposed through the plurality of through holes 151;

step (S123), forming the plurality of second through holes 136 and the plurality of first through holes 126 by etching the second metal layer 130 and the first metal layer 120 through the plurality of through holes 151; and step (S124), removing the mask layer 150.

In step (S121), the material of the mask layer 150 can be selected according to the material of the first metal layer 120 and the second metal layer 130 to ensure that the mask layer cannot be etched. In one embodiment, the material of the mask layer 150 can be photoresist.

In step (S122), a first portion of the second metal layer 130 can be exposed through the plurality of through holes 151, and a second portion of the second metal layer 130 is covered by the mask layer 150.

In step (S123), the second metal layer 130 and the first metal layer 120 can be etched through a acid solution. Thus the second mask layer 130 and the first metal layer 102 at the through hole 151 are etched to form the plurality of second through holes 136 and the plurality of first through holes 126. The acid solution can be hydrochloric acid, sulfuric acid, or nitric acid. In one embodiment, the acidic solution of hydrochloric acid.

Because the carbon nanotube layer 110 has the plurality of apertures 112, after the first portion of the second metal layer 130 are etched, the acid solution will penetrate the carbon nanotube layer 110 and continuously etch the first metal layer. Thus the plurality of first through holes 126 are formed in the first metal layer 120, and the plurality of first through holes 126 and the plurality of second through holes 136 are opposite to each other one by one.

Furthermore, a second mask layer (not shown) can be applied on the first metal layer to protect the first mask layer. The second mask layer also defines a plurality of third through holes according the plurality of through holes 151 in the mask layer 150. Thus the carbon nanotube layer 110 can be exposed through the plurality of third through holes and the plurality of through holes 151.

The method of making transmission electron microscope micro-grid has following advantages. The first metal layer and the second metal layer are formed on the carbon nanotube layer via electroplating method, thus the first metal layer and the second metal layer can be bonded on the carbon nanotube layer, and the carbon nanotubes can be tightly combined with the metal layer. The stability of the transmission electron microscope micro-grid can be improved. Furthermore, the electron emitter can withstand a strong electric field force.

Figure 8:
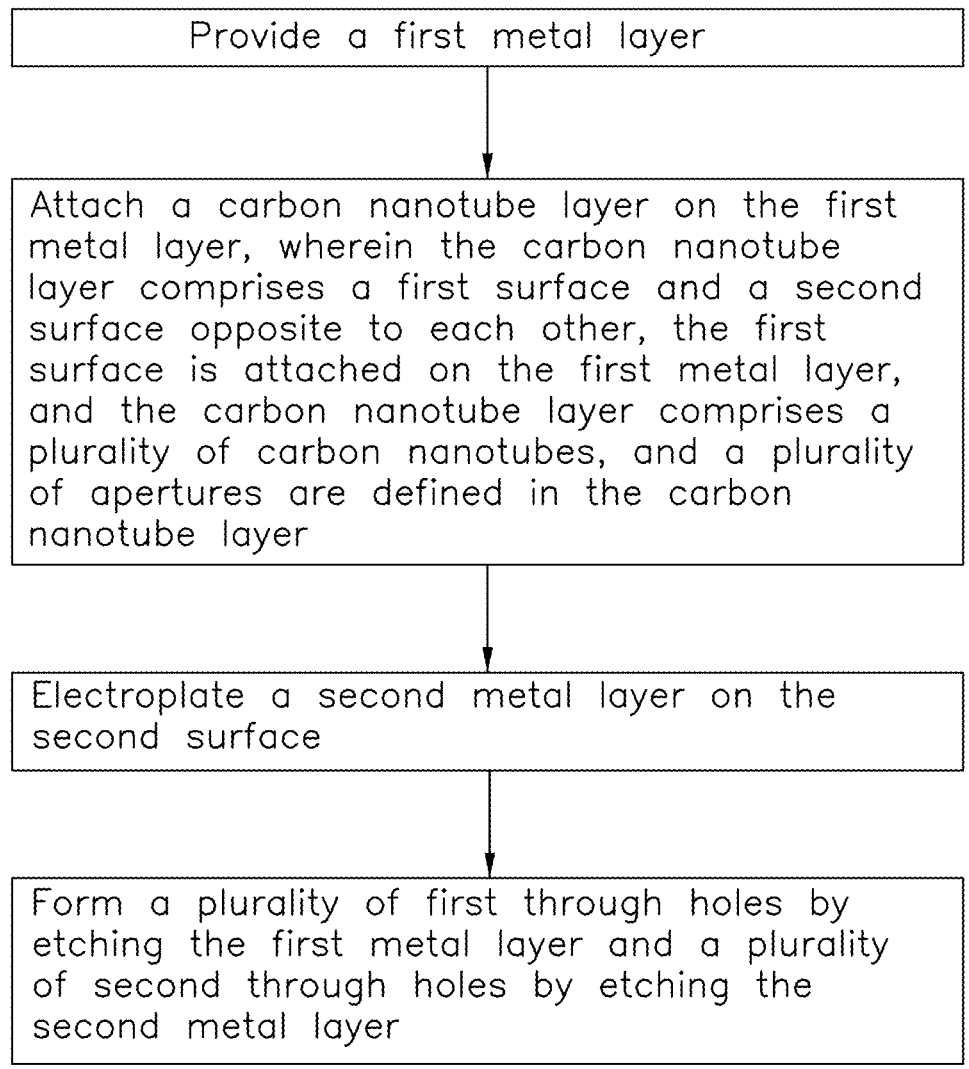
FIG. 8 shows a flowchart of another embodiment of a method of making transmission electron microscope micro-grid.

Referring to FIG. 8, another embodiment of a method of making transmission electron microscope micro-grid 10 comprises:

step (S20), providing a first metal layer 120;

step (S21), attaching a carbon nanotube layer 110 on the first metal layer 120, wherein the carbon nanotube layer 110 comprises a first surface 111 and a second surface 113 opposite with each other, and the first surface 111 is attached to the first metal layer 120;

step (S22), electroplating a second metal layer 130 on the second surface 113; and step (S23), forming a plurality of first through holes 126 and a plurality of second through holes 136 by etching the first metal layer 120 and the second metal layer 130.

The method of making transmission electron microscope micro-grid 10 in this embodiment is similar with the method of making transmission electron microscope micro-grid 10 in the embodiment described above, except that the carbon nanotube layer 110 is firstly attached on the first metal layer 120, and the second metal layer 130 is then electroplated on the carbon nanotube layer 110 and combined with the first metal layer 120.

In step (S21), the first metal layer 120 can be tightly combined with the carbon nanotube layer 110 and support the carbon nanotube layer 110. In one embodiment, a thickness of the metal layer 120 is about 10 micrometers. Thus the first metal layer 120 has certain mechanical strength.

In step (S22), during the process of the depositing the second metal layer 130, the second metal layer 130 will be penetrate the carbon nanotube layer 110 through the plurality of apertures 112 in the carbon nanotube layer 110. Thus the second metal layer 130 will be integrated with the first metal layer 120 to form an integrated structure. The carbon nanotube layer 110 is firmly sandwiched between the first metal layer 120 and the second metal layer 130.

Depending on the embodiment, certain steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

Finally, it is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

What is claimed is:

1. A transmission electron microscope micro-grid comprising:
    a carbon nanotube layer comprising a first surface and a second surface opposite to the first surface, wherein the carbon nanotube layer comprises a plurality of carbon nanotubes;
    a first metal layer attached on the first surface;
    a second metal layer attached on the second surface;
    wherein the first metal layer and the second metal layer are bonded with the carbon nanotube layer via a plurality of dangling bonds on the plurality of carbon nanotubes, the first metal layer defines a plurality of first through holes, the second metal layer defines a plurality of second through holes, and the carbon nanotube layer is exposed through the plurality of first through holes and the plurality of second through holes.

2. The transmission electron microscope micro-grid of claim 1, wherein the carbon nanotube layer is a free-standing structure and sandwiched between the first metal layer and the second metal layer.

3. The transmission electron microscope micro-grid of claim 1, wherein the carbon nanotube layer comprises a plurality of apertures, and the plurality of apertures penetrate the carbon nanotube layer along a direction of a thickness of the carbon nanotube layer.

4. The transmission electron microscope micro-grid of claim 3, wherein the first metal layer and the second metal layer are in direct contact with each other through the plurality of apertures to form an integrated structure.

5. The transmission electron microscope micro-grid of claim 1, wherein the plurality of dangling bonds are formed on an outer surface of each of the plurality of carbon nanotubes.

6. The transmission electron microscope micro-grid of claim 1, wherein the carbon nanotube layer comprises a plurality of carbon nanotube films, the plurality of carbon nanotubes in each of the plurality of carbon nanotube films are oriented along a preferred orientation, and the preferred orientations in different carbon nanotube films are intersected with each other.

7. The transmission electron microscope micro-grid of claim 1, wherein a first portion of the carbon nanotube layer is exposed through the plurality of first through holes and the plurality of second through holes, and a second portion of the carbon nanotube layer is sandwiched between the first metal layer and the second metal layer.

8. The transmission electron microscope micro-grid of claim 7, wherein the plurality of first through holes and the plurality of second through holes have the same distribution, and the plurality of first through holes and the plurality of second through holes are aligned opposite to each other.

9. The transmission electron microscope micro-grid of claim 8, wherein the first portion is suspended at the plurality of first through holes and the plurality of second through holes.

10. The transmission electron microscope micro-grid of claim 8, wherein the plurality of first through holes and the plurality of second through holes forms a plurality of through channel, and each of the plurality of through channel penetrates the first metal layer and the second metal layer.

11. The transmission electron microscope micro-grid of claim 1, wherein a thickness of the first metal layer ranges from about 1 micrometer to about 15 micrometers.

12. The transmission electron microscope micro-grid of claim 1, wherein a thickness of the second metal layer ranges from about 1 micrometer to about 15 micrometers.

13. A transmission electron microscope micro-grid comprising:
a carbon nanotube layer comprising a first surface and a second surface opposite to the first surface, wherein the carbon nanotube layer comprises a plurality of carbon nanotubes;
a first metal layer attached on the first surface and defining a plurality of first through holes; and
a second metal layer attached on the second surface and defining a plurality of second through holes;
wherein the carbon nanotube layer comprises a first portion and a second portion, the first portion of the carbon nanotube layer is sandwiched between the first metal layer and the second metal layer, the second metal layer is exposed through the plurality of first through holes and the plurality of second through holes, and the first portion is bonded with the carbon nanotube layer via a plurality of dangling bonds on the plurality of carbon nanotubes.

14. The transmission electron microscope micro-grid of claim 13, wherein the plurality of first through holes and the plurality of second through holes are opposite to each other, and the carbon nanotube layer is exposed through the plurality of first through holes and the plurality of second through holes.

15. The transmission electron microscope micro-grid of claim 13, wherein the first metal layer is continuously attached on the first surface, and the second metal layer is continuously attached on the second surface.

16. The transmission electron microscope micro-grid of claim 13, wherein the carbon nanotube layer defines a plurality of apertures.

17. The transmission electron microscope micro-grid of claim 16, wherein the second metal layer penetrates through the plurality of apertures and combined with the first metal layer.

* * * * *